(12) United States Patent
Saavedra et al.

(10) Patent No.: US 10,756,843 B2
(45) Date of Patent: *Aug. 25, 2020

(54) LOW-DELAY PACKET ERASURE CODING

(71) Applicants: National University of Ireland, Maynooth, Maynooth (IE); Massachusetts Institute of Technology, Cambridge, MA (US)

(72) Inventors: Andres Garcia Saavedra, Dublin (IE); Mohammad Karzand, Dublin (IE); Douglas Leith, Dublin (IE); Muriel Medard, Belmont, MA (US)

(73) Assignees: NATIONAL UNIVERSITY OF IRELAND, MAYNOOTH, Maynooth (IE); Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/277,255

(22) Filed: Feb. 15, 2019

(65) Prior Publication Data

US 2019/0253185 A1 Aug. 15, 2019

Related U.S. Application Data

(63) Continuation of application No. 15/305,893, filed as application No. PCT/EP2015/052890 on Feb. 11, 2015, now Pat. No. 10,243,692.

(30) Foreign Application Priority Data

Mar. 14, 2014 (GB) .................................. 1404535.5

(51) Int. Cl.
*H04L 1/00* (2006.01)
*H03M 13/13* (2006.01)
(Continued)

(52) U.S. Cl.
CPC ........ *H04L 1/0034* (2013.01); *H03M 13/154* (2013.01); *H04L 1/0041* (2013.01);
(Continued)

(58) Field of Classification Search
CPC ... H04L 1/0034; H04L 1/0052; H04L 5/0058; H04L 12/1863; H04L 1/0033;
(Continued)

(56) References Cited

U.S. PATENT DOCUMENTS 6,694,478 B1 2/2004 Martinian et al.
7,559,010 B2 * 7/2009 Shen .................... H03M 13/118
714/752

(Continued)

FOREIGN PATENT DOCUMENTS

WO WO 2010/025362 A2 3/2010
WO WO 2012/154196 A1 11/2012

OTHER PUBLICATIONS

Invitation Pursuant to Rule 137(4) EPC and Article 94(3) EPC dated Mar. 18, 2019 for European Application No. 15 705 263.0; 2 pages.
(Continued)

*Primary Examiner* — Shelly A Chase
(74) *Attorney, Agent, or Firm* — Daly, Crowley, Mofford & Durkee, LLP

(57) ABSTRACT

Provided is a method for correcting errors in a data transmission network, comprising: transmitting a plurality of uncoded information packets across a network path; transmitting a plurality of coded packets for recovering information packets lost in transmission across said network path, the coded packets being temporally interspersed among said uncoded information packets, wherein the coded packets are encoded based on information packets transmitted prior to a
(Continued)

previously transmitted coded packet; and determining the interspersion of the coded packets according to a packet loss rate.

22 Claims, 4 Drawing Sheets

(51) Int. Cl.
| | |
|---|---|
| *H03M 13/15* | (2006.01) |
| *H04L 1/18* | (2006.01) |
| *H04L 5/00* | (2006.01) |
| *H04L 1/12* | (2006.01) |
| *H04L 1/16* | (2006.01) |
| *H03M 13/05* | (2006.01) |

(52) U.S. Cl.
CPC ........... *H04L 1/0057* (2013.01); *H03M 13/05* (2013.01); *H03M 13/13* (2013.01); *H04L 1/0033* (2013.01); *H04L 1/0035* (2013.01); *H04L 1/0052* (2013.01); *H04L 1/12* (2013.01); *H04L 1/16* (2013.01); *H04L 1/1607* (2013.01); *H04L 1/18* (2013.01); *H04L 1/1812* (2013.01); *H04L 1/1819* (2013.01); *H04L 1/1825* (2013.01); *H04L 5/003* (2013.01); *H04L 5/006* (2013.01); *H04L 5/0044* (2013.01); *H04L 5/0058* (2013.01)

(58) Field of Classification Search
CPC .. H04L 1/0045; H04L 1/0041; H03M 13/118; H03M 13/616; H03M 13/154; H03M 13/373
See application file for complete search history.

(56) References Cited

U.S. PATENT DOCUMENTS

| | | | |
|---|---|---|---|
| 9,215,082 B2 * | 12/2015 | Liu | ..................... H04L 12/1863 |
| 9,515,775 B2 * | 12/2016 | Zhovnirnovsky | ... H03M 13/616 |
| 10,243,692 B2 | 3/2019 | Saavedra et al. | |
| 2010/0046371 A1 | 2/2010 | Sundararajan et al. | |
| 2012/0290900 A1 | 11/2012 | Paniconi | |

OTHER PUBLICATIONS

Response to Invitation Pursuant to Rule 137(4) EPC and Article 94(3) EPC dated Mar. 18, 2019 for European Application No. 15 705 263.0 as filed on Apr. 10, 2019: 3 pages.
Intention to Grant dated Aug. 19, 2019 for European Application No. 15 705 263.0; 7 pages.
Chinese Office Action and English translation for Chinese Appl. No. 201580024057.8 dated Mar. 4, 2019;19 pages.
Response to Chinese Office Action dated Mar. 4, 2019 for Chinese Appl. No. 201580024057.8 as filed on Apr. 4, 2019; 26 pages.
Amendment and English translation as filed in Response to Examiner Interview on Sep. 17, 2019 for Chinese Appl. No. 201580024057. 8; 25 pages.
Karzand, et al.; "Low Delay Random Linear Coding Over a Stream;" Fifty-second Annual Allerton Conference; Allerton House; UIUC; Oct. 103, 2014; p. 521-528; 8 Pages.
PCT International Search Report of the ISA for PCT/EP2015/ 052890 dated May 4, 2015; 4 Pages.
PCT Written Opinion of the ISA for PCT/EP2015/052890 dated May 4, 2015; 6 Pages.
Communication Pursuant to Article 94(3) EPC dated Sep. 14, 2018 for European Application No. 15705263.0; 4 Pages.
Response to Communication Pursuant to Article 94(3) EPC dated Sep. 14, 2018 for European Application No. 15705263.0; Response filed Apr. 10, 2019; 2 Pages.
U.S. Non-Final Office Action dated Apr. 12, 2018 for U.S. Appl. No. 15/305,893; 20 Pages.
Response to U.S. Non-Final Office Action dated Apr. 12, 2018 for U.S. Appl. No. 15/305,893; Response filed Aug. 3, 2018; 26 Pages.
Supplemental Amendment to U.S. Non-Final Office Action dated Apr. 12, 2018 for U.S. Appl. No. 15/305,893; Supplemental Amendment filed Nov. 9, 2018; 7 Pages.
U.S. Notice of Allowance dated Nov. 14, 2018 for U.S. Appl. No. 15/305,893; 13 Pages.
312 Amendment filed on Dec. 3, 2018 for U.S. Appl. No. 15/305,893; 7 Pages.

* cited by examiner

LOW-DELAY PACKET ERASURE CODING

FIELD

The present application relates to erasure coding in a data communication network.

BACKGROUND OF THE INVENTION

When transmitting packets across a communication network, packets may be lost for a variety of reasons, for example due to noise on wireless links, queue overflow, cache misses, etc. Re-transmitting lost packets increases the delay in communication and to avoid this, additional redundant coded packets can be sent and a receiver can reconstruct lost packets from these—this is typically referred to as forward error correction (FEC).

The standard FEC approach is to partition a stream of information packets into disjoint blocks of size NR packets, where N is the block size and R the coding rate. Then, N(1−R) coded packets for a block are transmitted immediately after all information packets in the block have been transmitted and each coded packet can help the receiver reconstruct any of the information packets within the specified block (but not packets in any other block).

For example, consider a stream of information packets indexed k=0, 1, 2, . . . . This is partitioned into blocks of size NR, with block K containing information packets K, K+1, . . . , K+NR−1. Observe that each information packet is assigned to a single block. For block K, coded packets may be generated in many ways. One example is by random linear coding, as described below.

Importantly, a coded packet (i) contains information about every information packet in block K, and (ii) contains no information about packets in other blocks. This is illustrated in FIG. 1, where a conventional block code consisting of NR=4 information packets $u_1$, $u_2$, $u_3$ and $u_4$ is followed by two redundant coded packets $e_1$ and $e_2$. Thus, the block illustrated in FIG. 1 has a block size of N=6, and a coding rate of R=2/3.

The rationale for transmitting coded packets after all information packets in a block have been sent is twofold. Firstly, that causality requires that a coded packet can only protect information packets transmitted prior to the coded packet. Secondly, by transmitting coded packets after all information packets in a block then each coded packet can help protect al of the information packets in a block. This ensures that the redundant packets offer the required protection against expected packet loss and make maximum use of the available network throughput capacity. Indeed this conventional block coding approach is asymptotically throughput optimal, that is, it maximises use of available network capacity as the block size is made sufficiently large.

However, because coded packets are placed at the end of a block, recovery of lost packets cannot take place until all NR information packets have been transmitted and received, and so error correction comes at the cost of a delay which is roughly proportional to the block size NR. Typically information packets need to be delivered in-order to an application at the receiver. Hence, when a packet is lost, all subsequent information packets must be buffered at the receiver until the missing information packet can be reconstructed, and so these packets all suffer increased delay proportional to the block size NR.

Maximising use of available throughput capacity has traditionally been a primary design aim in communication networks, even at the cost of high delay, since throughput capacity has been the scarcest network resource. However, in modem networks excess network capacity is commonly available due to the prevalent approach to network quality of service management of over-provisioning. That is, network capacity is often no longer the scarcest network resource. Instead, delay is the primary performance bottleneck and achieving low delay is becoming a primary design driver even if achieving low delay comes at the cost of less efficient use of available network throughput capacity.

In view of the above, it is difficult to ensure low delay in-order delivery of packets across a lossy communication link. The conventional approach is to use block codes as described above, possibly with the addition of retransmission of lost packets to recover from decoding failure. Convolution codes (as widely used at the physical layer on wireless links) are a special case of this type of block code plus retransmit scheme. Due to the in-order delivery delay with such codes being roughly proportional to the block size NR, most of the work to date on reducing delay has focussed on working with smaller block sizes, while retaining the same code construction of locating coded packets at the end of the transmission block—see for example Subramanian & Leith, "On a Class of Optimal Rateless Codes", Proc Allerton Conference 2008 and references therein. In the special case of bursty packet losses with a known upper limit on the number of packet losses, Martinian has proposed a low delay code construction but this is not systematic (information packets are never transmitted uncoded) and is confined to a specific loss channel, see Martinian & Sundberg, "Burst Erasure Correction Codes with Low Decoding Delay", IEEE Trans Information Theory, 2004.

Accordingly, there is a need to address the above-described problems.

SUMMARY

The present teaching provides a method for temporally interspersing redundant coded packets amongst information packets in a way which greatly reduces delay compared to the standard block code approach. The interspersion of the coded packets is dependent on a packet loss rate and other factors.

Accordingly, the present application provides a method as detailed in claim 1. Advantageous features are provided in the dependent claims.

BRIEF DESCRIPTION OF THE DRAWINGS

The present application will now be described with reference to the accompanying drawings in which.

DETAILED DESCRIPTION OF THE DRAWINGS

Figure 1:
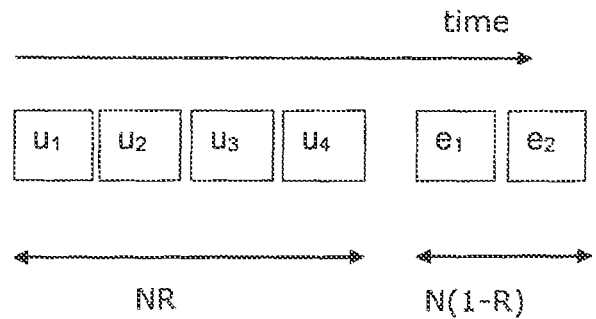
FIG. 1 illustrates a conventional block code consisting of four information packets followed by two redundant coded packets, the coded packets protect information packets $u_1$-$u_4$ only.
Figure 2:
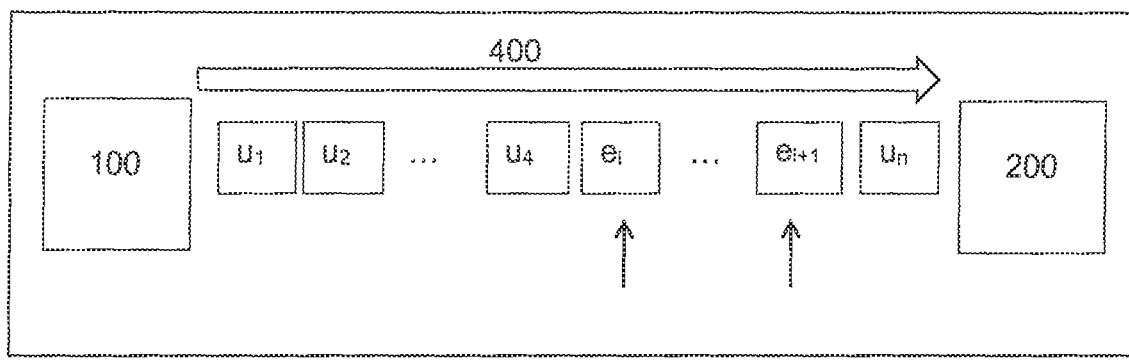
FIG. 2 is a block diagram of a network architecture comprising a transmitting node and a receiver node.

The present teaching provides a method of scheduling transmission of coded packets so as to significantly reduce the in-order packet delivery delay at a receiver. FIG. 2 is a block diagram of a network architecture 300 comprising a transmitter node 100 and a receiver node 200. Information packets $u_i$ are transmitted from the transmitter node 100 to the receiver node 200 across a network path 400. Redundant coded packets $e_i$ for recovering lost information packets are interspersed among the information packets $u_i$. The transmitter node 100 is configured to perform the methods of the present teaching.

In the context of the present teaching, a packet is assumed to have a fixed packet length, each packet encapsulating a plurality of data symbols. Corresponding symbols from packet to packet typically comprise parallel symbol streams, with all coding and decoding operations being performed symbol-wise on the whole packet. That is, an entire packet serves as the basic unit of data, i.e., as a single unknown, with the same operation being performed on each of a plurality of data symbols within the packet. Each data symbol may correspond, for example, to one byte or word. The main advantage of this view is that decoding matrix operations can be performed at the granularity of packets instead of individual symbols and so packet overhead can be distributed across a number of symbols.

Figure 3:
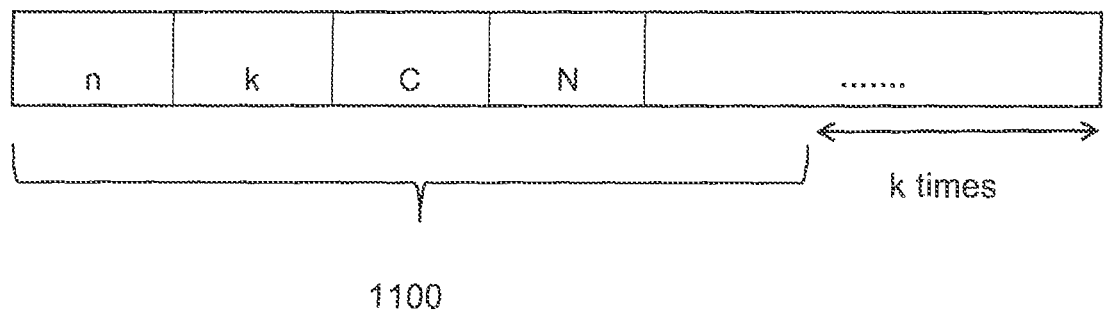
FIG. 3 illustrates a typical structure of a network coding header of a redundant coded packet.

In the presently described embodiments, information packets are sent in uncoded form and only redundant packets are sent in coded form. An uncoded information packet contains one or more data symbols. In the embodiments, a coded packet is created as a combination of previously transmitted information packets. If receiver feedback is available, the coded packet construction can be simplified by excluding information packets which are known to have arrived safely at the receiver node 200. For example, a coded packet may be created by forming a random linear combination of previously sent but unacknowledged information packets. The header of a coded packet contains information that the receiver node 200 needs to make use of the coded packet. The header structure will now be discussed in more detail. A coding header 1100 of a coded packet is illustrated in FIG. 3. When using a random linear code the coding header 1100 may comprise at least the following information.

n: The number of information packets combined in the packet.

k: the index of the first information packet in the coded combination

C: The seed for a pseudo-random number generator that can be used by the receiver to generate the coefficients $c_i$ used in the random linear combination Accordingly, by virtue of including the above information in the header, the identity of the specific combination of packets that make up a specific coded packet can be conveyed in the header.

Figure 4:
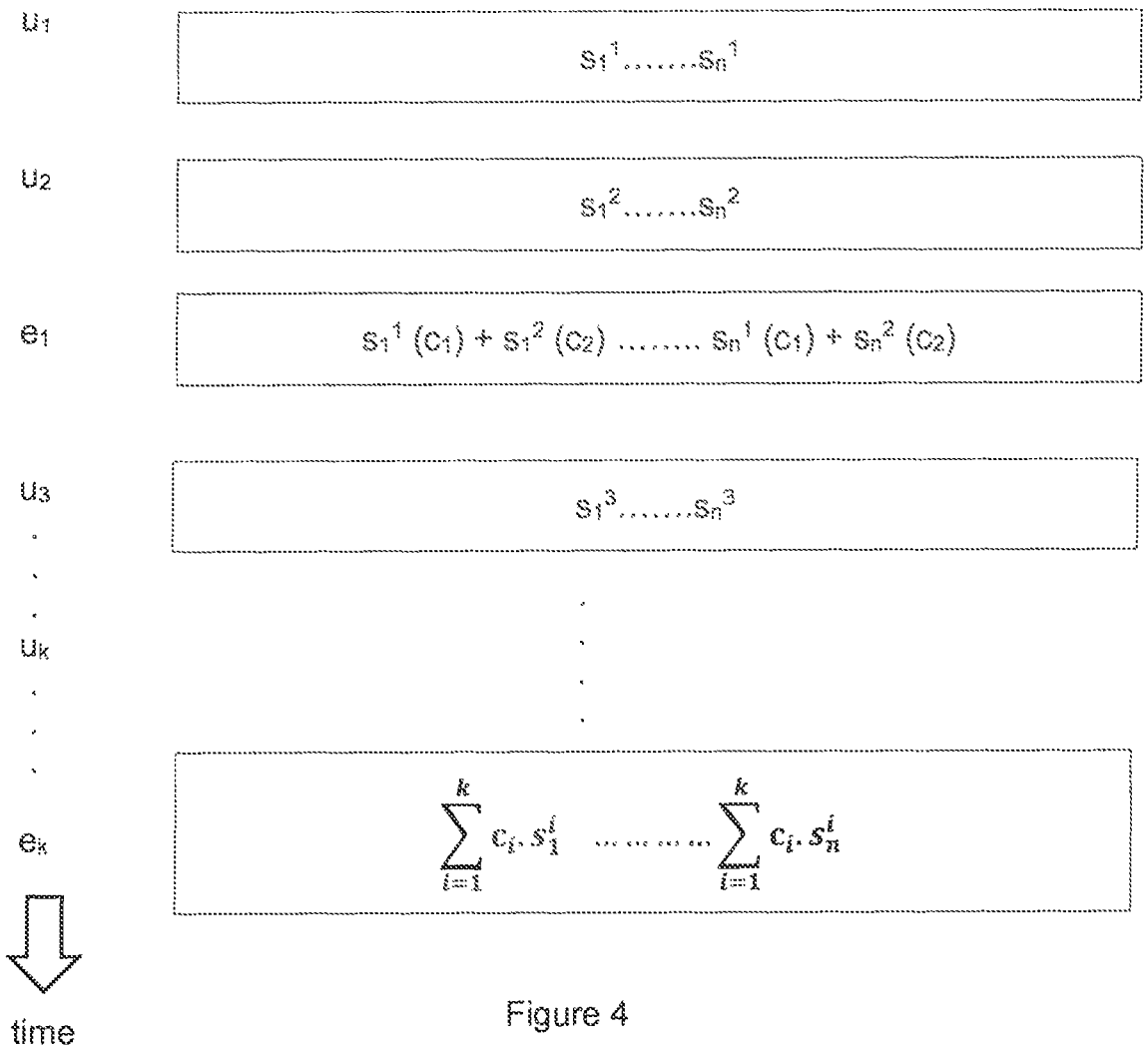
FIG. 4 illustrates a temporal sequence of uncoded information packets and redundant coded packets.

FIG. 4 illustrates the typical structure of a stream of information packets transmitted across a network path and temporally interspersed with redundant coded packets, according to an embodiment of the present teaching. The arrow shown in FIG. 4 indicates temporal progression. Referring to FIG. 4, each information packet $u_i$ may comprise one or more data symbols $s_1^i$ to $s_n^i$. These data symbols may, for example, be bits or bytes and can be mapped to values in some agreed finite field e.g. GF(2) when symbols are bits and GF(256) when symbols are bytes. The information packets $u_i$ are transmitted in uncoded form. Redundant coded packets $e_i$ are temporally interspersed among the information packets $u_i$. Each coded packet $e_i$ comprises coded symbols, with each coded symbol being a combination of the preceding data symbols. For example, when random linear coding is used then coded packet $e^k$ comprises coded symbols $e_i^k = \sum_{k=K}^{K+NR-1} c_k s_i^k$, i=1, 2, ..., n where $c_k$ is a weighting coefficient drawn uniformly at random from the same finite field as the data symbols. Note that since in the embodiments each coded packet depends on preceding information packets, not limited to information packets in a specified block, this code construction is fundamentally different from simply concatenating conventional block codes. As mentioned above, if receiver feedback is available, data symbols from information packets which have been seen or decoded at the receiver node 200 may be omitted from coded symbol $e_i^k$. Also as described above, each coded packet has a header informing the receiver of the values of the coefficients $c_i$, i=1, 2, ..., n etc.

Figure 5:
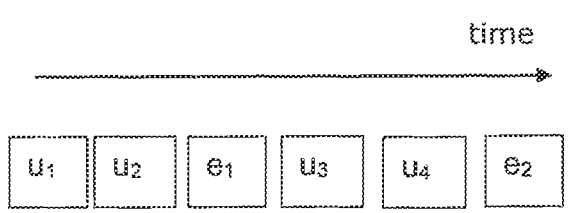
FIG. 5 illustrates the transmission order of four information packets with two redundant coded packets equidistantly interspersed amongst the information packets.

In detail, suppose there are NR information packets indexed 1, 2, ..., NR and a budget of N(1−R) additional redundant packets. In one embodiment of the present teaching, individual redundant packets are equidistantly interspersed amongst the information packets, i.e., a redundant packet is transmitted after each R/(1−R) information packets. This is illustrated in FIG. 5 for N=6, R=2/3.

The following example is provided to explain a random linear coding scheme. Referring again to FIG. 5, suppose there are 4 information packets $u_1$, $u_2$, $u_3$ and $u_4$, and 2 equidistantly interspersed coded packets $e_1$ and $e_2$. Suppose packets $u_1$ and $u_2$ are lost, so that $e_i$, $u_3$, $u_4$, and $e_2$ are received. From these the receiver node can construct the following linear equations:

$$\begin{bmatrix} e_1 \\ u_3 \\ u_4 \\ e_2 \end{bmatrix} = \begin{bmatrix} c_1^1 & c_2^1 & 0 & 0 \\ 0 & 0 & 1 & 0 \\ 0 & 0 & 0 & 1 \\ c_1^2 & c_2^2 & c_3^2 & c_4^2 \end{bmatrix} \begin{bmatrix} u_1 \\ u_2 \\ u_3 \\ u_4 \end{bmatrix}$$

(where here we use $u_1$, $u_2$ etc to indicate respective data symbols from packets $u_1$, $u_2$ etc) and the full set of information packets thus can be reconstructed Provided the matrix is full rank. Thus, $u_1$ and $u_2$ can be recovered by solving the linear equations.

In another example, suppose $u_1$ and $u_3$ are lost, and $u_2$, $e_1$, $u_4$, and $e_2$ are received. From this Information, the receiver node can construct the following linear equations:

$$\begin{bmatrix} u_2 \\ e_1 \\ u_4 \\ e_2 \end{bmatrix} = \begin{bmatrix} 0 & 1 & 0 & 0 \\ c_1^1 & c_2^1 & 0 & 0 \\ 0 & 0 & 0 & 1 \\ c_1^2 & c_2^2 & c_3^2 & c_4^2 \end{bmatrix} \begin{bmatrix} u_1 \\ u_2 \\ u_3 \\ u_4 \end{bmatrix}$$

In this manner, $u_1$ and $u_3$ can be recovered. In general, coded packet $e_j$ is a weighted sum of a number of preceding information packets, and particularly, where feedback from a receiver is available, all sent but unacknowledged information packets. For example, suppose a coded packet is transmitted after every second information packet so that the packet stream is $u_n, u_{n+1}, e_j, u_{n+2}, u_{n+3}, e_{j+1}$ and information packets $u_n$ and $u_{n+1}$ are lost. Then the receiver node 200 can reconstruct $u_n$ and $u_{n+1}$ after receiving $e_j \, u_{n+2} \, u_{n+3} \, e_{j+1}$ when it will have the following linear equations:

$$\begin{bmatrix} e_j \\ u_{n+2} \\ u_{n+3} \\ e_{j+1} \end{bmatrix} = \begin{bmatrix} c_n^j & c_{n+1}^j & 0 & 0 \\ 0 & 0 & 1 & 0 \\ 0 & 0 & 0 & 1 \\ c_n^{j+1} & c_{n+1}^{j+1} & c_{n+2}^{j+1} & c_{n+3}^{j+1} \end{bmatrix} \begin{bmatrix} u_n \\ u_{n+1} \\ u_{n+2} \\ u_{n+3} \end{bmatrix}$$

Suppose now the packet stream $u_1, u_2, e_1, u_3, u_4, e_2, u_5, u_6, e_3, u_7, u_8, e_4$ is transmitted. For a streaming code, $e_1$ is a weighted sum of $u_1$ and $u_2$, $e_2$ a sum of $u_1$-$u_4$, $e_3$ a sum of $u_1$-$u_6$, and $e_4$ a sum of $u_1$-$u_8$. Thus, coded packets are not constructed over disjoint sets of information packets but are constructed over overlapping sets of information packets. This streaming code construction therefore differs fundamentally from conventional block code constructions.

Essentially, the above examples show that packets received jointly satisfy specified algebraic linear equations. If some of the packets are lost, the receiver node can solve the equations to derive the missing packet(s).

The transmitter node 100 may accept packets from a source and buffer the packets into a buffer, until they are ACKed by the receiver node 200. The transmitter node 100 then generates and sends random linear combinations of the packets in the buffer. The coefficients used in the linear combination are also conveyed in the header of each of the coded packets.

Upon receiving a coded packet, the receiver node 200 first retrieves the coding coefficients from the header and appends the linear combination to the basis matrix of its knowledge space. Then, the receiver node 200 determines which packet is newly seen so that this packet can be ACKed. The receiver node 200 may also maintain a buffer of linear combinations of packets that have not been decoded yet. If some of the packets are lost, the receiver node 200 can solve the linear equations to derive the missing packet(s).

A preferred embodiment when no receiver feedback is available is as follows. Suppose a stream of information packets indexed k=0, 1, 2, . . . is to be transmitted across a lossy network path. Let p be the packet loss rate on the network path. Packet loss occurs when one or more data packets travelling across a network path fail to reach their destination. The packet loss rate is defined as the rate of packet loss across a network path, and has a value between 0 and 1. For example, a packet loss rate of 1 would indicate that every packet is lost. Transmission of coded packet j is scheduled after information packet j/p. Thus, it can be seen that the scheduling of the transmission of coded packet j is a function of the packet loss rate p, and not a block code size. Typically j/p is not an integer, in which case time-sharing can be used between the values floor(j/p) and ceil(j/p) such that the mean value is j/p. Coded packet j can be used to help reconstruct any information packets having an index less than j/p, as described above. Pseudo-code of this embodiment is as follows:

ALGORITHM 1

Low delay coding

1:  Initialise uncoded_nxt
2:  p ← packet loss rate
3:  n ← floor(1/p)
4:  while all information packets not recv'd do
5:      Wait until a transmission opportunity occurs
6:      if n ≠ 0 then
7:          send uncoded packet uncoded_nxt
8:          uncoded_nxt ← uncoded_nxt + 1
9:          n ← n − 1
10:     else
11:         send coded packet, coding over previously transmitted
            information packets
12:         ñ ← 1/p
13:         $n = \begin{cases} \text{ceil}(\tilde{n}) & \text{with prob } \tilde{n} - \text{floor}(\tilde{n}) \\ \text{floor}(\tilde{n}) & \text{otherwise} \end{cases}$ 14: end if where uncoded_nxt is the index of the next information packet to be transmitted and line 13 implements the time sharing of coded and information packets.

Observe that there is no use of block coding in this method—coded packets are not constructed over disjoint sets of information packets but instead are constructed using overlapping sets of information packets. Observe also that the code is systematic. That is, information packets are sent uncoded and only redundant packets are sent in coded form, so providing for an efficient implementation. Lastly, observe that the key element of the present teaching is the decision as to when to transmit a redundant/coded packet within the information packet stream. Thus, the present teaching provides a method for determining when to schedule transmission of a redundant/coded packet. The key aspect of the present teaching is the scheduling of the transmission of the coded packets in relation to each other. In effect, a method is provided for determining the interspersion of the coded packets within information packets.

As mentioned above, random linear coding is merely one example of the mapping methods that can be used to construct coded packets from information packets.

Commonly receiver feedback is available e.g. via ACK packets. This feedback may include information on the information packets seen or decoded by the receiver node 200, the degrees of freedom received and the indexes of the packets which have been lost from the transmitted packet stream. A new unit of information corresponds mathematically to a degree of freedom. Essentially, once n degrees of freedom have been obtained, a message that would have required n uncoded packets can be decoded. An appropriate interpretation of the degree of freedom allows one to order the receiver degrees of freedom in a manner consistent with the packet order of the source. Whenever the transmitter node 100 is allowed to transmit, it sends a random linear combination of all packets in the coding window. Second, the receiver node 200 acknowledges degrees of freedom and not original packets. The notion of seen packets defines an ordering of the degrees of freedom that is consistent with packet sequence numbers, and can therefore be used to acknowledge degrees of freedom.

In the present teaching, the method may be adapted to use the feedback information in three ways. Firstly, information may be used on seen/decoded packets at the receiver node 200. There is no need to code over information packets which are known to have been seen or decoded by the receiver node 200, thereby simplifying the construction of coded packets. The use of feedback information in this way is well known, as disclosed for example in U.S. Pat. No. 8,526,451B2.

Secondly, information on degrees of freedom received and packets lost can be used to adapt the transmission scheduling of redundant/coded packets. Specifically, additional coded packets may be transmitted if there is a deficit in degrees of freedom due to excessive packet loss, or fewer coded packets may be transmitted if fewer than expected packet losses have occurred.

Thirdly, information on packets lost can be used to estimate the packet loss rate p, and adapt the spacing between coding packets if p changes.

Accordingly, the present teaching uses feedback information to adapt transmission scheduling or interspersion frequency of coded packets. Adaptation using feedback can be readily implemented, for example applying pseudo-code as follows:

ALGORITHM 2

Low delay coding with receiver feedback

```
1:  initialise uncoded_nxt
2:  while all information packets not recv'd do
3:      Wait until a transmission opportunity occurs
4:      dofs ← received degrees of freedom reported by receiver
5:      dofs_inflight ← number of sent but unacknowledged data packets
6:      p ← packet loss rate
7:      ñ ← ((uncoded_nxt dofs)/(1-p)) − dofs_inflight
8:      if ñ <= 0 then
9:          send uncoded packet uncoded_nxt
10:         uncoded_nxt ← uncoded_nxt+1
11:     else
12:
        n = { ceil(ñ)   with prob ñ − floor(ñ)
            { floor(ñ)  otherwise
13:         if (n > 0) then
14:             send coded packet, coding over sent but unacknowl-
            edged
                                 information packets
15:         end if
16:  end while
```

Line 13 of Algorithm 2 implements use of feedback on seen/decoded packets at the receiver node 200 when constructing coded packets. Line 7 implements use of feedback on degrees of freedom and lost packets to adapt the transmission scheduling or interspersion frequency of coded packets. Use of feedback on lost packets allows bookkeeping of packets in flight to be carried out.

Figure 6:
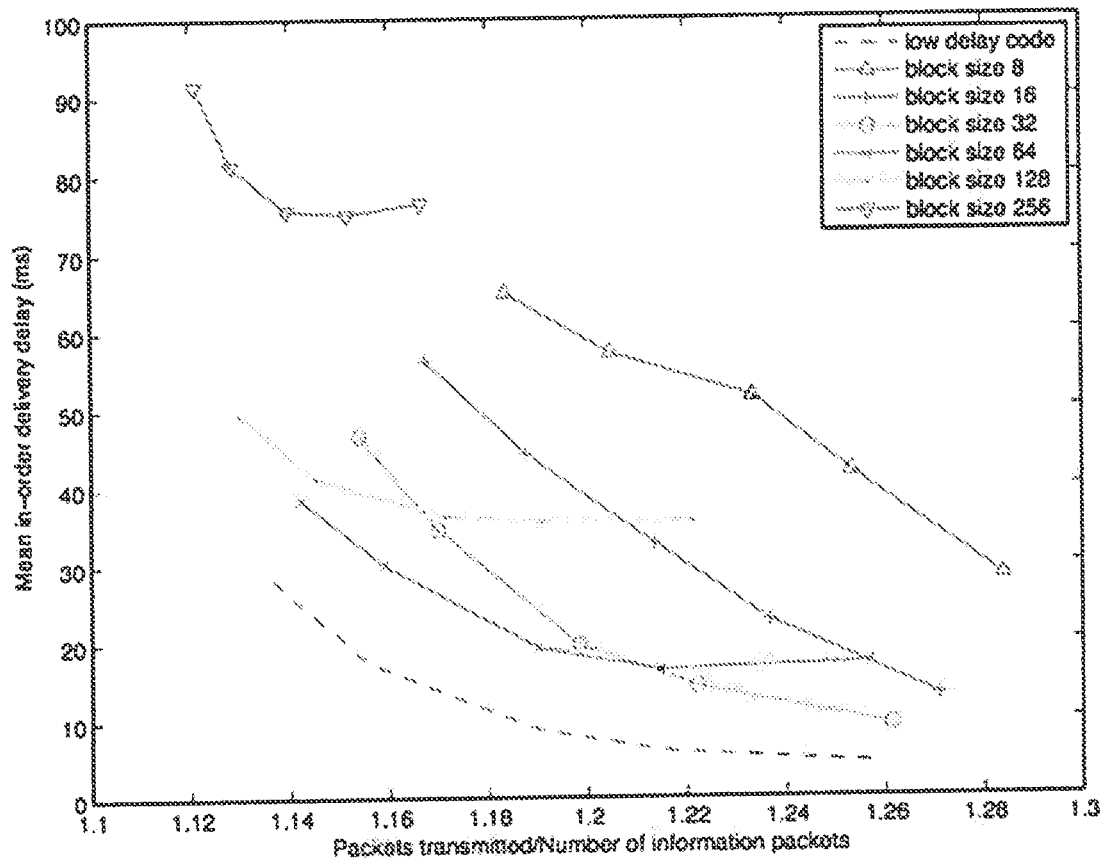
FIG. 6 is a graph illustrating mean delay vs overall number of packets transmitted for block coding and low delay coding according to an embodiment of the present teaching.

For a given budget of packets that can be transmitted (both coded and information packets), the method offers lower in-order delivery delay than any block code; see for example FIG. 6. FIG. 6 illustrates mean delay vs overall number of packets transmitted for block coding (using blocks of various sizes) and low delay coding using Algorithm 2. Link rate: 25 Mbps, RTT: 60 ms, packet loss rate: 10%, receiver feedback.

When the transmitter node 100 and/or the receiver node 200 are computationally constrained, it can be beneficial to limit the number of information packets that each coded packet protects. For example, to construct coded packet j rather than coded symbols $e_i^j = \Sigma_{k=0}^{j/p} c_k s_i^k$, $i=1, 2, \ldots, n$. The sum could be modified to $$e_i^j = \sum_{k=\max(\frac{1}{p}-N,0)}^{j/p} c_k s_i^k,$$

$i=1, 2, \ldots, n$ where parameter N specifies the maximum number of information packets used to construct the coded packet. Alternatively, the stream of information packets is partitioned into chunks and the above streaming code is applied within each chunk. These are straightforward extensions to the method.

In another embodiment of the present teaching, coded packets may be positioned using the following randomised approach. Whenever a packet transmission opportunity arises, the transmitter node 100 tosses a weighted coin and with probability R transmits an information packet and with probability 1-R transmits a coded packet. As before, the coded packets may be constructed in a number of ways, for example, as a random linear combination of preceding information packets.

Figure 7A:
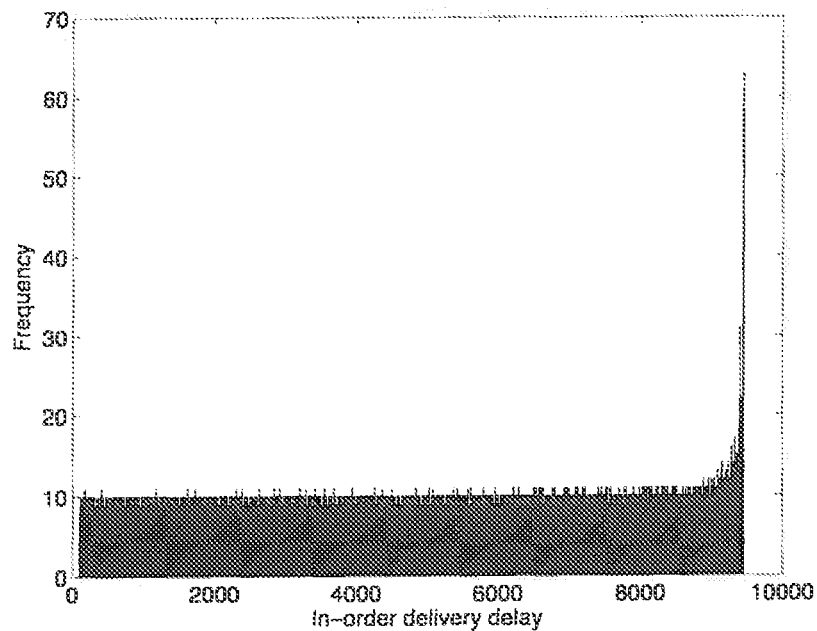
FIG. 7a is a graph illustrating measurements of in-order packet delivery delay when using a conventional block code over an erasure channel with a packet loss rate of 0.01, N=10,000, and R=0.99.
Figure 7B:
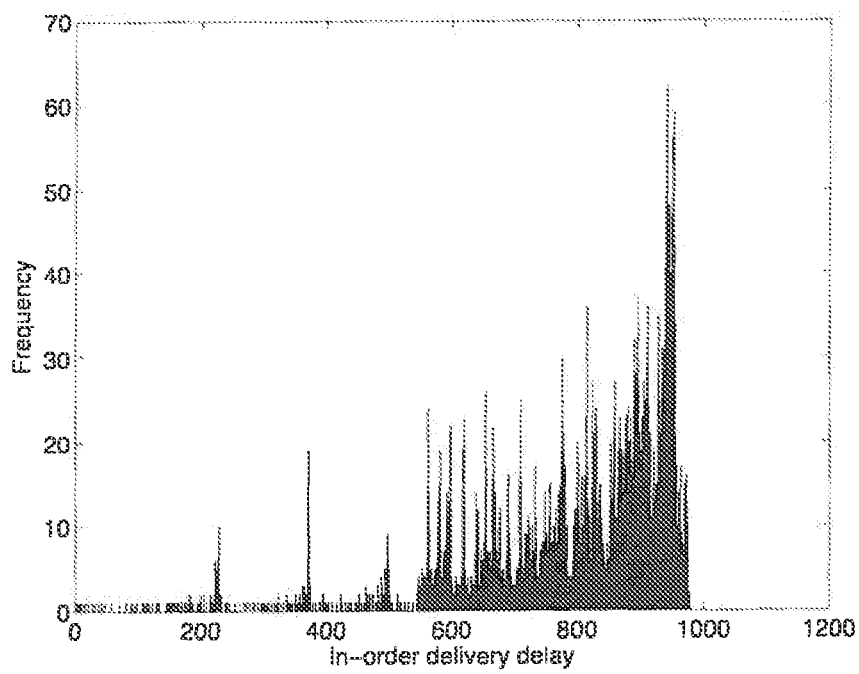
FIG. 7b is a graph illustrating the corresponding measured in-order delivery delay when using equidistant spacing of coded packets.

The gains in delay performance possible are illustrated in FIGS. 7a and 7b. FIG. 7a shows measurements of the in-order packet delivery delay when using a conventional block code over an erasure channel with a packet loss rate of 0.01, N=10,000, and R=0.99. FIG. 7b shows the corresponding measured in-order delivery delay when using equidistant spacing of coded packets. It can be seen that with the conventional block code the delay is close to the block size of 10,000. In contrast, with the low delay scheme the maximum delay is a factor of 10 lower.

In a still further embodiment, the transmitter 100 is arranged to transmit packets across multiple network paths 400 to the receiver 200. Such a transmitter would typically comprise a number of network interfaces, each using different technologies to access the Internet such as cellular networks or fixed access networks as well as wired or wireless local access networks. These technologies exhibit different quality characteristics in terms of coverage, capacity, power consumption, geographical availability and cost.

A number of schemes have been proposed for scheduling the transmission of information packets across such network paths including as described in PCT Publication No. WO2011/101425, U.S. Pat. Nos. 8,780,693, 8,036,226, 8,824,480, 7,230,921 and US Publication No. US2013/0077501. Indeed any suitable scheme for scheduling information packets across such network paths can be employed and one such improved scheme is disclosed in co-filed UK Application No. 1502257.7 (Attorney Ref: N18-619-06GB).

In one multi-path embodiment, the transmitter 100 determines a packet loss rate for each network path, for example, as described above. The transmitter then schedules the transmission of coded packets through the available network path with the highest loss rate. This is based on the observation that if information packets are less likely to be lost, coded packets can be lost as they are less likely to be needed.

As has been described above, the present teaching provides a method for interspersing redundant packets amongst information packets in a way which greatly reduces delay compared to the standard block code approach. The delay is not constrained to be proportional to disjoint blocks of size N packets. This substantial delay reduction does come at the cost of reduced error correction efficiency, so the resulting codes are no longer capacity achieving. Nevertheless, it can be favourable to trade capacity for lower delay in this way since capacity may be plentiful whereas delay is tightly constrained. This is commonly the case in modem communication networks.

The words comprises/comprising when used in this specification are to specify the presence of stated features, integers, steps or components but does not preclude the presence or addition of one or more other features, integers, steps, components or groups thereof.

The invention claimed is:

1. An apparatus comprising:
   a transmitting node configured to:
   transmit a plurality of uncoded information packets to at least one receiving node;
   transmit a plurality of coded packets for recovering uncoded information packets lost in transmission to the at least one receiving node, the coded packets being temporally interspersed among said uncoded information packets,
   wherein each uncoded information packet comprises one or more uncoded data symbol,
   wherein the coded packets are encoded using random linear network coding and a coded packet $e_j$ comprises one or more coded symbols (b) determined as:

$$b_i^j = \sum_{k=K}^{K+NR-1} c_k s_i^k, \ i=1,2,\ldots,n$$

in which:
   k is an index;
   j is a coded packet index;
   n is a number of the one or more uncoded data symbols in the uncoded information packet;
   $b_i^j$ represents an ith coded symbol for a jth coded packet;
   $c_k$ represents a kth weighting coefficient drawn at random from a finite field;
   $s_i^k$ represents an ith data symbol of a kth uncoded information packet;
   K is an index of the first uncoded information packet used for encoding the coded packet; and
   NR is a number of uncoded information packets combined in the coded packet,
   wherein each of the coded packets is encoded based on uncoded information packets such that each of the coded packets is not limited to uncoded information packets in a specified block; and
   intersperse the coded packets amongst the uncoded information packets according to at least one of:
   interspersing the coded packets amongst the uncoded information packets according to a packet loss rate; or
   interspersing the coded packets amongst the uncoded information packets by equidistantly interspersing the coded packets amongst the uncoded information packets.

2. The apparatus of claim 1, wherein the coded packets amongst the uncoded information packets are interspersed according to interspersing the coded packets amongst the uncoded information packets according to feedback information from the receiving node.

3. The apparatus of claim 2, wherein the feedback information comprises an acknowledgement (ACK), indicating that a receiver node has received a combination of information packets and which information packet of the combination of information packets has been newly seen.

4. The apparatus of claim 2, wherein the feedback information comprises at least one of:
   number of information packets seen or decoded by the receiver;
   received degrees of freedom, denoted dofs, reported by the receiver; and
   the number of packets lost.

5. The apparatus of claim 4, wherein the interspersion frequency of the coded packets is inversely proportional to the received degrees of freedom (dofs).

6. The apparatus of claim 4, wherein the interspersion frequency of the coded packets is a function of an expression ((uncoded_nxt−dofs)/(1−p))−dofs_inflight, where uncoded_nxt is an index of a next information packet to be transmitted, wherein p is the packet loss rate and dofs_inflight is a number of transmitted but unacknowledged data packets.

7. The apparatus of claim 1, wherein the transmitting node is further configured to:
   construct the coded packets as a function of temporally overlapping sets of information packets.

8. The apparatus of claim 1, wherein the transmitting node is further configured to:
   partition the stream of information packets into chunks and providing coded packet $e_j$ to be used to reconstruct any lost information packets in the chunk containing information packet ceil(j/p) or floor (j/p), where p is the packet loss rate.

9. The apparatus of claim 1, wherein an interspersion frequency of the coded packets is inversely proportional to the packet loss rate.

10. The apparatus of claim 1, wherein the transmitting node is further configured to: construct the coded packets as a random linear combination of preceding information packets.

11. The apparatus of claim 1, wherein the transmitting node is further configured to:
    receive an acknowledgement (ACK) when a receiver node receives a random linear combination of information packets; and
    determine which information packet of said random linear combination of information packets has been newly seen.

12. The apparatus of claim 1, wherein the transmitting node is further configured to transmit to the at least one receiving node a seed for a pseudo-random number generator that can be used by the at least one receiving node to generate the coefficients used in the random linear network coding of the coded packet.

13. The apparatus of claim 1, wherein the $k_{th}$ weighting coefficient is drawn at random from a same finite field as the uncoded data symbols.

14. An apparatus comprising:
    a receiving node configured to:
    receive a plurality of uncoded information packets across a network path from at least one transmitting node;
    receive a plurality of coded packets for recovering uncoded information packets lost in transmission from the at least one transmitting node, the coded packets being temporally interspersed among said uncoded information packets; and
    recover the uncoded information packets lost in transmission based upon the plurality of uncoded information packets and the plurality of coded packets,
    wherein each uncoded information packet comprise one or more uncoded data symbol,
    wherein the coded packets are encoded using random linear network coding and a coded packet $e_j$ comprises one or more coded symbols (b) determined as:

$$b_i^j = \sum_{k=K}^{K+NR-1} c_k s_i^k, \ i=1,2,\ldots,n$$

in which:
    k is an index;
    j is a coded packet index;
    n is a number of the one or more uncoded data symbol in the uncoded information packet;
    $b_i^j$ represents an ith coded symbol for a jth coded packet;

$c_k$ represents a kth weighting coefficient drawn at random from a finite field;

$s_i^k$ represents an ith data symbol of a kth uncoded information packet;

K is an index of the first uncoded information packet used for encoding the coded packet; and NR is a number of uncoded information packets combined in the coded packet, wherein each of the coded packets is encoded based on uncoded information packets such that each of the coded packets is not limited to uncoded information packets in a specified block; and wherein the coded packets are interspersed amongst the uncoded information packets according to at least one of:

interspersing the coded packets amongst the uncoded information packets according to a packet loss rate; or interspersing the coded packets amongst the uncoded information packets by equidistantly interspersing the coded packets amongst the uncoded information packets.

15. The apparatus of claim 14, wherein the coded packets amongst the uncoded information packets are interspersed according to interspersing the coded packets amongst the uncoded information packets according to feedback information from the receiving node.

16. The apparatus of claim 15, wherein the feedback information comprises an acknowledgement (ACK), indicating that a receiver node has received a combination of information packets and which information packet of the combination of information packets has been newly seen.

17. The apparatus of claim 15, wherein the feedback information comprises at least one of:

number of information packets seen or decoded by the receiver;

received degrees of freedom, denoted dofs, reported by the receiver; and the number of packets lost.

18. The apparatus of claim 17, wherein the interspersion frequency of the coded packets is inversely proportional to the received degrees of freedom (dofs).

19. The apparatus of claim 17 wherein the interspersion frequency of the coded packets is a function of an expression ((uncoded_nxt−dofs)/(1−p))−dofsinflight, where uncoded_nxt is an index of a next information packet to be transmitted, wherein p is the packet loss rate and dofsinflight is a number of transmitted but unacknowledged data packets.

20. The apparatus of claim 14, wherein an interspersion frequency of the coded packets is inversely proportional to the packet loss rate.

21. The apparatus of claim 14, wherein the receiving node is further configured to receive from at least one transmitting node a seed for a pseudo-random number generator that can be used by the receiving node to generate the coefficients used in the random linear network coding of the coded packet.

22. The apparatus of claim 14, wherein the $k_{th}$ weighting coefficient is drawn at random from a same finite field as the uncoded data symbols.

\* \* \* \* \*